(12) United States Patent
Foster et al.

(10) Patent No.: US 10,055,966 B2
(45) Date of Patent: Aug. 21, 2018

(54) SYSTEM AND METHOD FOR DETERMINATION AND REMEDIATION OF ENERGY DIVERSION IN A SMART GRID NETWORK

(71) Applicant: Delta Energy & Communications, Inc., Murrieta, CA (US)

(72) Inventors: Scott Foster, Murrieta, CA (US);
Angelo Borrelli, Fairhope, AL (US);
Keith Teichmann, Newton Centre, MA (US)

(73) Assignee: DELTA ENERGY & COMMUNICATIONS, INC., Murrieta, CA (US)

( * ) Notice: Subject to any disclaimer, the term of this patent is extended or adjusted under 35 U.S.C. 154(b) by 0 days.

(21) Appl. No.: 15/257,302

(22) Filed: Sep. 6, 2016

(65) Prior Publication Data
US 2017/0132902 A1 May 11, 2017

Related U.S. Application Data

(60) Provisional application No. 62/213,815, filed on Sep. 3, 2015.

(51) Int. Cl.
*G08B 21/18* (2006.01)
*H04L 29/08* (2006.01)
(Continued)

(52) U.S. Cl.
CPC ....... *G08B 21/182* (2013.01); *G01R 21/1333* (2013.01); *H04L 67/10* (2013.01);
(Continued)

(58) Field of Classification Search
None
See application file for complete search history.

(56) References Cited

U.S. PATENT DOCUMENTS

| 2,704,809 A | 3/1955 | Williams |
| 4,724,381 A | 2/1988 | Crimmins |

(Continued)

FOREIGN PATENT DOCUMENTS

| CN | 101860978 | 10/2010 |
| CN | 102255869 | 11/2011 |

(Continued)

OTHER PUBLICATIONS

Devidas, A. R. and Ramesh, M. V., "Wireless Smart Grid Design for Monitoring and Optimizing Electric Transmission in India," 2010 Fourth International Conference on Sensor Technologies and Applications, Jul. 18-25, 2010, Venice, IEEE, pp. 637-640 (2 pages).

(Continued)

*Primary Examiner* — Leon-Viet Nguyen
(74) *Attorney, Agent, or Firm* — Ware, Fressola, Maguire & Barber LLP

(57) ABSTRACT

An apparatus, system and method are provided for detecting purposeful energy diversion in a smart grid network. A transformer monitoring device is configured to measure the amount of electricity supplied by a transformer to a plurality of structures and electric meters are configured to measure electricity usage at each of the plurality of structures. The electric meters transmit signaling containing information regarding measured electricity usage to the transformer monitoring device and the transformer monitoring device transmits signaling to a cloud-based server containing information regarding the amount of electricity supplied by the transformer to the plurality of structures and the measured electricity usage. The cloud-based server is configured to determine based on the received signaling if energy diversion is occurring in the smart grid network.

10 Claims, 4 Drawing Sheets

(51) Int. Cl.
  *G01R 21/133*    (2006.01)
  *G06Q 50/06*    (2012.01)
  *G06F 3/14*    (2006.01)

(52) U.S. Cl.
  CPC .............. *H04L 67/12* (2013.01); *G06F 3/14* (2013.01); *G06Q 50/06* (2013.01)

(56) References Cited

U.S. PATENT DOCUMENTS

| | | |
|---|---|---|
| 5,426,360 A | 6/1995 | Maraio et al. |
| 5,748,104 A | 5/1998 | Argyroudis et al. |
| 5,940,009 A | 8/1999 | Loy et al. |
| 6,018,449 A | 1/2000 | Nelson et al. |
| 6,211,764 B1 | 4/2001 | Schweitzer, Jr. |
| 6,300,881 B1 | 10/2001 | Yee et al. |
| 6,549,120 B1 | 4/2003 | de Buda |
| 6,711,512 B2 | 3/2004 | Noh |
| 6,829,491 B1 | 12/2004 | Yea et al. |
| 6,856,256 B2 | 2/2005 | Winkler |
| 6,880,086 B2 | 4/2005 | Kidder et al. |
| 6,906,630 B2 | 6/2005 | Georges et al. |
| 6,998,962 B2 | 2/2006 | Cope et al. |
| 7,049,976 B2 | 5/2006 | Hunt et al. |
| 7,054,770 B2 | 5/2006 | Swarztrauber et al. |
| 7,058,524 B2 | 6/2006 | Hayes et al. |
| 7,107,329 B1 | 9/2006 | Schroder et al. |
| 7,126,558 B1 | 10/2006 | Dempski |
| 7,271,735 B2 | 9/2007 | Rogai |
| 7,304,587 B2 | 12/2007 | Boaz |
| 7,310,052 B2 | 12/2007 | Bowman |
| 7,402,993 B2 | 7/2008 | Morrison |
| 7,440,436 B2 | 10/2008 | Cheng et al. |
| 7,496,078 B2 | 2/2009 | Rahman |
| 7,733,839 B1 | 6/2010 | Frank et al. |
| 7,747,534 B2 | 6/2010 | Villicana et al. |
| 7,764,943 B2 | 7/2010 | Radtke |
| 7,894,371 B2 | 2/2011 | Bonta et al. |
| 7,936,163 B2 | 5/2011 | Lee, Jr. |
| 7,940,039 B2 | 5/2011 | de Buda |
| 7,961,740 B2 | 6/2011 | Flammer, III et al. |
| 8,054,199 B2 | 11/2011 | Addy |
| 8,060,259 B2 | 11/2011 | Budhraja et al. |
| 8,121,741 B2 | 2/2012 | Taft et al. |
| 8,145,732 B2 | 3/2012 | Kumar et al. |
| 8,194,275 B2 | 6/2012 | Furst et al. |
| 8,279,870 B2 | 10/2012 | Flammer, III et al. |
| 8,305,932 B2 | 11/2012 | Qiu et al. |
| 8,311,863 B1 | 11/2012 | Kemp |
| 8,370,697 B2 | 2/2013 | Veillette |
| 8,385,978 B2 | 2/2013 | Leung et al. |
| 8,401,709 B2 | 3/2013 | Cherian et al. |
| 8,412,735 B2 | 4/2013 | Yeh et al. |
| 8,428,021 B2 | 4/2013 | Karunakaran et al. |
| 8,437,883 B2 | 5/2013 | Powell et al. |
| 8,441,372 B2 | 5/2013 | Smith et al. |
| 8,452,555 B2 | 5/2013 | Swarztrauber et al. |
| 8,509,953 B2 | 8/2013 | Taft |
| 8,543,250 B2 | 9/2013 | Seo et al. |
| 8,553,561 B1 | 10/2013 | Chokshi et al. |
| 8,566,046 B2 | 10/2013 | Deaver, Sr. |
| 8,583,520 B1 | 11/2013 | Forbes, Jr. |
| 8,600,572 B2 | 12/2013 | Sri-Jayantha |
| 8,660,868 B2 | 2/2014 | Vogel et al. |
| 8,755,303 B2 | 6/2014 | Hughes et al. |
| 8,792,626 B2 | 7/2014 | Cook et al. |
| 8,847,826 B2 | 9/2014 | Rao et al. |
| 8,855,102 B2 | 10/2014 | Borleske et al. |
| 8,862,281 B2 | 10/2014 | Yoneda et al. |
| 8,874,477 B2 | 10/2014 | Hoffberg |
| 8,880,234 B2 | 11/2014 | Sekoguchi et al. |
| 8,909,358 B2 | 12/2014 | Kamouskos |
| 8,917,716 B2 | 12/2014 | Tran |
| 8,937,497 B1 | 1/2015 | Tobin |
| 8,959,114 B2 | 2/2015 | Rehman |
| 8,963,807 B1 | 2/2015 | Lee et al. |
| 8,964,757 B2 | 2/2015 | Watson et al. |
| 8,965,590 B2 | 2/2015 | Boardman et al. |
| 8,970,394 B2 | 3/2015 | Veillette |
| 9,002,670 B2 | 4/2015 | Hurri et al. |
| 9,013,173 B2 | 4/2015 | Veillette |
| 9,014,996 B2 | 4/2015 | Kamel et al. |
| 9,043,174 B2 | 5/2015 | Arya et al. |
| 9,052,216 B2 | 6/2015 | Kamel et al. |
| 9,087,451 B1 | 7/2015 | Jarrell |
| 9,110,101 B2 | 8/2015 | Pietrowicz et al. |
| 9,112,381 B2 | 8/2015 | Carralero et al. |
| 9,118,219 B2 | 8/2015 | Booth |
| 9,129,355 B1 | 9/2015 | Harvey et al. |
| 9,141,653 B2 | 9/2015 | Zhou et al. |
| 9,144,082 B2 | 9/2015 | Rubin et al. |
| 9,162,753 B1 | 10/2015 | Panto et al. |
| 9,400,192 B1 | 7/2016 | Salser, Jr. et al. |
| 9,400,867 B2 | 7/2016 | Boyd et al. |
| 9,402,292 B1 | 7/2016 | Goldin et al. |
| 9,451,060 B1 | 9/2016 | Bowers et al. |
| 9,654,173 B2 | 5/2017 | Barzegar et al. |
| 2001/0038342 A1 | 11/2001 | Foote |
| 2002/0046368 A1 | 4/2002 | Friedrich et al. |
| 2002/0064010 A1 | 5/2002 | Nelson et al. |
| 2003/0050737 A1 | 3/2003 | Osann, Jr. |
| 2003/0078996 A1 | 4/2003 | Baldwin |
| 2003/0128149 A1* | 7/2003 | Miceli .................. G01S 7/412 |
| | | 342/22 |
| 2004/0082203 A1 | 4/2004 | Logvinov et al. |
| 2005/0078624 A1 | 4/2005 | Shu et al. |
| 2006/0007016 A1 | 1/2006 | Borkowski et al. |
| 2006/0056363 A1 | 3/2006 | Ratiu et al. |
| 2006/0141940 A1 | 6/2006 | Bloom et al. |
| 2007/0043849 A1 | 2/2007 | Lill et al. |
| 2007/0048702 A1 | 3/2007 | Jang et al. |
| 2007/0088630 A1 | 4/2007 | MacLeod et al. |
| 2008/0100436 A1 | 5/2008 | Banting et al. |
| 2008/0109387 A1 | 5/2008 | Deaver et al. |
| 2008/0317047 A1 | 12/2008 | Zeng et al. |
| 2009/0003662 A1 | 1/2009 | Joseph et al. |
| 2009/0088907 A1 | 4/2009 | Lewis et al. |
| 2009/0111456 A1 | 4/2009 | Shaffer et al. |
| 2009/0146839 A1 | 6/2009 | Reddy et al. |
| 2009/0167558 A1 | 7/2009 | Borleske et al. |
| 2009/0187284 A1 | 7/2009 | Kreiss et al. |
| 2009/0267792 A1 | 10/2009 | Crichlow |
| 2010/0074176 A1 | 3/2010 | Flammer, III et al. |
| 2010/0313146 A1 | 12/2010 | Nielsen et al. |
| 2011/0047230 A1 | 2/2011 | McGee |
| 2011/0066297 A1 | 3/2011 | Saberi et al. |
| 2011/0090833 A1 | 4/2011 | Kneckt et al. |
| 2011/0208367 A1 | 8/2011 | Sackman et al. |
| 2012/0007885 A1 | 1/2012 | Huston |
| 2012/0029897 A1 | 2/2012 | Cherian et al. |
| 2012/0050971 A1 | 3/2012 | Seal et al. |
| 2012/0059609 A1 | 3/2012 | Oh et al. |
| 2012/0078686 A1 | 3/2012 | Bashani |
| 2012/0089268 A1 | 4/2012 | Torre et al. |
| 2012/0092114 A1 | 4/2012 | Matthews |
| 2012/0126994 A1 | 5/2012 | Sobotka et al. |
| 2012/0131324 A1 | 5/2012 | Ansari et al. |
| 2012/0229089 A1 | 9/2012 | Bemmel et al. |
| 2012/0230237 A1 | 9/2012 | Gong et al. |
| 2012/0242698 A1 | 9/2012 | Haddick et al. |
| 2012/0249741 A1 | 10/2012 | Maciocci et al. |
| 2012/0253881 A1 | 10/2012 | Schneider et al. |
| 2012/0265355 A1* | 10/2012 | Bernheim .............. G05B 15/02 |
| | | 700/286 |
| 2012/0277926 A1 | 11/2012 | Nielsen et al. |
| 2012/0303746 A1 | 11/2012 | Yu et al. |
| 2012/0316688 A1 | 12/2012 | Boardman et al. |
| 2012/0316696 A1 | 12/2012 | Boardman et al. |
| 2013/0026986 A1 | 1/2013 | Parthasarathy et al. |
| 2013/0035802 A1 | 2/2013 | Khaitan et al. |
| 2013/0069985 A1 | 3/2013 | Wong et al. |
| 2013/0077610 A1 | 3/2013 | Amini et al. |
| 2013/0123998 A1 | 5/2013 | King et al. |
| 2013/0190939 A1 | 7/2013 | Lenox |
| 2013/0203378 A1 | 8/2013 | Vos et al. |

(56) References Cited

U.S. PATENT DOCUMENTS

| | | |
|---|---|---|
| 2013/0218495 A1 | 8/2013 | Boone et al. |
| 2013/0222215 A1 | 8/2013 | Kobayashi |
| 2013/0278437 A1 | 10/2013 | Wyk |
| 2013/0278631 A1 | 10/2013 | Border et al. |
| 2013/0289782 A1 | 10/2013 | Giroti |
| 2013/0297087 A1 | 11/2013 | Koster et al. |
| 2013/0297239 A1 | 11/2013 | Arya et al. |
| 2013/0297868 A1 | 11/2013 | Yin et al. |
| 2013/0304264 A1 | 11/2013 | Shao |
| 2014/0067330 A1 | 3/2014 | Flammer, III |
| 2014/0092765 A1 | 4/2014 | Agarwal et al. |
| 2014/0098685 A1 | 4/2014 | Shattil |
| 2014/0129160 A1 | 5/2014 | Tran |
| 2014/0167977 A1 | 6/2014 | Bean et al. |
| 2014/0172133 A1 | 6/2014 | Snyder |
| 2014/0183964 A1* | 7/2014 | Walley ............... H04B 5/0075 307/104 |
| 2014/0233620 A1 | 8/2014 | Bernheim et al. |
| 2014/0237525 A1 | 8/2014 | Rothschild et al. |
| 2014/0241354 A1 | 8/2014 | Shuman et al. |
| 2014/0244017 A1 | 8/2014 | Freiwirth et al. |
| 2014/0244768 A1 | 8/2014 | Shuman et al. |
| 2014/0244833 A1 | 8/2014 | Sharma et al. |
| 2014/0267400 A1 | 9/2014 | Mabbutt et al. |
| 2014/0270749 A1 | 9/2014 | Miniscalo et al. |
| 2014/0277813 A1 | 9/2014 | Powell et al. |
| 2014/0279694 A1 | 9/2014 | Gauger et al. |
| 2014/0289004 A1 | 9/2014 | Monforte et al. |
| 2014/0297206 A1 | 10/2014 | Silverman |
| 2014/0300210 A1* | 10/2014 | Abi-Ackel ............ H04Q 9/00 307/130 |
| 2014/0300344 A1 | 10/2014 | Turner et al. |
| 2014/0306525 A1 | 10/2014 | Greer et al. |
| 2014/0312802 A1 | 10/2014 | Recker et al. |
| 2014/0320306 A1 | 10/2014 | Winter |
| 2014/0334073 A1 | 11/2014 | Thompson et al. |
| 2014/0361907 A1 | 12/2014 | Bernheim et al. |
| 2014/0368189 A1* | 12/2014 | Bernheim ............ G01R 22/066 324/115 |
| 2014/0371941 A1 | 12/2014 | Keller et al. |
| 2014/0372583 A1 | 12/2014 | Tseng |
| 2014/0376405 A1 | 12/2014 | Erickson et al. |
| 2014/0376914 A1 | 12/2014 | Miniscalo |
| 2014/0380488 A1 | 12/2014 | Datta Ray et al. |
| 2015/0002186 A1 | 1/2015 | Taft |
| 2015/0019342 A1 | 1/2015 | Gupta |
| 2015/0019553 A1 | 1/2015 | Shaashua et al. |
| 2015/0058445 A1 | 2/2015 | Choi et al. |
| 2015/0063202 A1 | 3/2015 | Mazzarella et al. |
| 2015/0066772 A1 | 3/2015 | Griffin et al. |
| 2015/0094874 A1 | 4/2015 | Hall et al. |
| 2015/0094968 A1 | 4/2015 | Jia et al. |
| 2015/0112469 A1 | 4/2015 | Da Silva Neto et al. |
| 2015/0121470 A1 | 4/2015 | Rongo et al. |
| 2015/0127601 A1 | 5/2015 | McGill et al. |
| 2015/0142963 A1 | 5/2015 | Choi et al. |
| 2015/0148979 A1 | 5/2015 | Forbes, Jr. |
| 2015/0149396 A1 | 5/2015 | Arya et al. |
| 2015/0155713 A1 | 6/2015 | Forbes, Jr. |
| 2015/0163849 A1 | 6/2015 | Bauer et al. |
| 2015/0179062 A1 | 6/2015 | Ralston et al. |
| 2015/0200846 A1 | 7/2015 | Hui et al. |
| 2015/0220762 A1* | 8/2015 | Jiang ................ G06K 7/10396 235/375 |
| 2015/0249595 A1 | 9/2015 | Geiger |
| 2015/0256433 A1 | 9/2015 | Sum et al. |
| 2015/0256435 A1 | 9/2015 | Sum et al. |
| 2015/0276433 A1 | 10/2015 | Brahmajosyula et al. |
| 2015/0281996 A1 | 10/2015 | Rubin et al. |
| 2015/0288532 A1 | 10/2015 | Veyseh et al. |
| 2015/0294557 A1 | 10/2015 | Willig et al. |
| 2015/0311951 A1 | 10/2015 | Hariz |
| 2015/0370615 A1 | 12/2015 | Pi-Sunyer |
| 2015/0373521 A1 | 12/2015 | Olesen et al. |
| 2015/0373641 A1 | 12/2015 | Yamana et al. |
| 2016/0029384 A1 | 1/2016 | Sidhu et al. |
| 2016/0134932 A1 | 5/2016 | Karp et al. |
| 2016/0214715 A1 | 7/2016 | Meffert |
| 2016/0292205 A1 | 10/2016 | Massey et al. |
| 2016/0327603 A1* | 11/2016 | Sonderegger .......... G01N 27/02 |
| 2016/0360361 A1 | 12/2016 | Ross et al. |
| 2017/0003142 A1 | 1/2017 | Allcorn et al. |
| 2017/0108236 A1 | 4/2017 | Guan et al. |
| 2017/0339536 A1 | 11/2017 | Lewis et al. |

FOREIGN PATENT DOCUMENTS

| | | |
|---|---|---|
| CN | 102355682 | 2/2012 |
| CN | 102412530 | 4/2012 |
| CN | 102508989 | 6/2012 |
| CN | 202513670 | 10/2012 |
| CN | 103078673 | 5/2013 |
| CN | 103209385 | 7/2013 |
| CN | 103313437 | 9/2013 |
| CN | 103488988 | 1/2014 |
| CN | 103810753 | 5/2014 |
| CN | 203965904 | 11/2014 |
| CN | 104238730 | 12/2014 |
| CN | 104333733 | 2/2015 |
| CN | 204142366 | 2/2015 |
| CN | 204203734 | 3/2015 |
| CN | 104485746 | 4/2015 |
| CN | 104581087 | 4/2015 |
| CN | 204465736 | 7/2015 |
| CN | 204595654 | 8/2015 |
| EP | 2296069 | 3/2011 |
| EP | 2818878 | 12/2014 |
| EP | 2721772 | 10/2015 |
| WO | 2009059386 | 5/2009 |
| WO | 2010003452 | 1/2010 |
| WO | 2011079358 | 7/2011 |
| WO | 2012047089 | 4/2012 |
| WO | 2012122454 | 9/2012 |
| WO | 2012142586 | 10/2012 |
| WO | 2012154938 | 11/2012 |
| WO | 2012155126 | 11/2012 |
| WO | 2013019595 | 2/2013 |
| WO | 2013028407 | 2/2013 |
| WO | 2013123445 | 8/2013 |
| WO | 2013173230 | 11/2013 |
| WO | 2014056558 | 4/2014 |
| WO | 2014091434 | 6/2014 |
| WO | 2014118622 | 8/2014 |
| WO | 2014123737 | 8/2014 |
| WO | 2014124318 | 8/2014 |
| WO | 2014130568 | 8/2014 |
| WO | 2014169018 | 10/2014 |
| WO | 2014175721 | 10/2014 |
| WO | 2015032164 | 3/2015 |
| WO | 2015046695 | 4/2015 |
| WO | 2015073687 | 5/2015 |
| WO | 2015105658 | 7/2015 |
| WO | 2015123623 | 8/2015 |
| WO | 2015131462 | 9/2015 |
| WO | 2015138447 | 9/2015 |
| WO | 2015161083 | 10/2015 |

OTHER PUBLICATIONS

Erol-Kantarci, M. and Mouftah, H. T., "Wireless Multimedia Sensor and Actor Networks for the Next Generation Power Grid," Ad Hoc Networks, vol. 9, Issue 4, Jun. 2011, pp. 542-551 (2 pages).

Gungor, V. C., Lu, B. and Hancke, G. P., "Opportunities and Challenges of Wireless Sensor Networks in Smart Grid," IEEE Transactions on Industrial Electronics, vol. 57, No. 10, Oct. 2010, pp. 3557-3564.

Nasipuri, A. et al., "Demo Abstract: Wireless Sensor Network for Substation Monitoring: Design and Deployment," ResearchGate Conference Paper, Jan. 2008 (3 pages).

St. John, Jeff, "How Utilities Could Use Virtual Reality and Google Glass to Monitor the Grid," Mar. 3, 2015, 6 pages.

(56) References Cited

OTHER PUBLICATIONS

InfoBright, "Internet of Things Part 8: Smart Grids—the Future of Energy Delivery," 2014, 2 pages, https://www.infobright.com/index.php/internet-of-things-part-8-smart-grids-future-energy-delivery/#.VdHztvIVhBd.

Monnier, Olivier, "A Smarter Grid With the Internet of Things," Texas Instruments, Oct. 2013, 11 pages.

Amin, R. et al., "Roadmap to Smart Grid Technology: A Review of Smart Information and Communication System," International Journal of Control and Automation, vol. 7, No. 8, 2014, pp. 407-418.

Elyengui, S. et al., "The Enhancement of Communication Technologies and Networks for Smart Grid Applications," International Journal of Emerging Trends & Technology in Computer Science, vol. 2, issue 6, Nov. 2013, pp. 107-115.

Qin, Z., "A Survey of Networking Issues in Smart Grid," www.cse.wustl.edu/~jain/cse570-13/ftp/smrtgrid/index.html, Dec. 20, 2013 (12 pages).

Güngör, V. et al., "Smart Grid Technologies: Communication Technologies and Standards," IEEE Transactions on Industrial Informatics, vol. 7, No. 4, Nov. 2011, pp. 529-539.

Güngör, V. et al., "A Survey on Communication Networks for Electric System Automation," Feb. 2006, available at: https://smartech.gatech.edu/bitstream/handle/1853/27879/electric_system_automation.pdf.

Zaballos, A. et al., "Heterogeneous Communication Architecture for the Smart Grid," IEEE Network, vol. 25, No. 5, Sep./Oct. 2011, pp. 30-37, available at: http://www.itk.ntnu.no/fag/TTK4545/TTK2/Pensum-filer/SmartGrid.pdf.

Clark, A. et al., "Wireless Networks for the Smart Energy Grid: Application Aware Networks," Proceedings of the International MultiConference of Engineers and Computer Scientists, vol. 2, Mar. 17-19, 2010, available at: http://www.iaeng.org/publication/IMECS2010/IMECS2010_pp1243-1248.pdf.

Parikh, P. et al., "Opportunities and Challenges of Wireless Communication Technologies for Smart Grid Applications," 2010, available at: http://citeseerx.ist.psu.edu/viewdoc/download?doi=10.1.1.453.7100&rep=rep1&type=pdf.

Detlef Zuehlke, "SmartFactory—Towards a factory-of-things." Annual Reviews in Control, 34.1, Mar. 28, 2010, pp. 129-138.

Artem Katasonov, et al., "Smart Semantic Middleware for the Internet of Things", Jan. 2008, 11 pages.

Andrea Zanella, et al., "Internet of Things for Smart Cities." IEEE Internet of Things Journal, vol. 1, Iss. 1, Feb. 2014, pp. 22-32.

Dieter Uckelmann, et al., "An Architectural Approach Towards the Future Internet of Things." Architecting the Internet of Things, Springer-Verlag Berlin Heidelberg, 2011, pp. 1-24.

Ning Zhong, et al., "Research challenges and perspectives on Wisdom Web of Things (W2T)." The Journal of Supercomputing, Nov. 26, 2010, 21 pages.

International Search Report and Written Opinion dated Oct. 28, 2016 issued in international patent application No. PCT/US2016/045233 (10 pages).

International Search Report and Written Opinion dated Dec. 9, 2016 in international patent application No. PCT/US2016/046509 (13 pages).

International Search Report and Written Opinion dated May 26, 2017 in counterpart international patent application No. PCT/US2017/019434 (10 pages).

International Search Report and Written Opinion dated Jan. 23, 2017 in international patent application No. PCT/US2016/049245 (16 pages).

International Search Report and Written Opinion dated Jan. 19, 2017 in international patent application No. PCT/US2016/058407 (16 pages).

International Search Report and Written Opinion dated Jan. 25, 2017 in international patent application No. PCT/US2016/058383 (13 pages).

Lockheed Martin, "Self-Powered Ad-hoc Network", http://www.lockheedmartin.com/us/products/span.html, accessed Nov. 9, 2015.

Owada, et al., "Design for Disaster-Tolerant and Dependable Network Architecture," ICMU 2012, pp. 136-141, Information Processing Society of Japan, 2012.

Morganthaler, et al., "UAVNet: A Mobile Wireless Mesh Network Using Unmanned Aerial Vehicles," available at http://rvs.unibe.ch/research/pub_files/MBZSA12.pdf, 2012.

Snow, "Why Drones Are the Future of the Internet of Things", Dec. 1, 2014, available at https://www.suasnews.com/2014/12/why-drones-are-the-future-of-the-internet-of-things/.

GridSense, "Maximize Intelligence and Minimize Costs at the Distribution Level," http://www.gridsense.com/solutions-products/transformer-monitoring/distribution-transformer-monitoring/, accessed Oct. 13, 2015, 3 pages.

Balakrishnan et al., "Models for Planning Capacity Expansion in Local Access Telecommunication Networks," Massachusetts Institute of Technology Sloan School Working Paper #3048-89-MS, Aug. 1989, 88 pages.

Corte-Real et al., "Network flow models for the local access network expansion problem," Computers & Operations Research vol. 34, 2007, pp. 1141-1157.

Bauer, "Bundling, Differentiation, Alliances and Mergers: Convergence Strategies in U.S. Communication Markets," Communications & Strategies, No. 60, Dec. 2005, online at http://mpra.ub.uni-muenchen.de/2515/, pp. 59-93.

Balakrishnan et al., "Models for Planning the Evolution of Local Telecommunication Networks," Massachusetts Institute of Technology Operations Research Center working paper, OR195-89, May 1989, 80 pages.

"Smart meter," http://en.wikipedia,org/wiki/Smart_meter, Nov. 10, 2009, 4 pages.

Smart Grid Northwest, "Qualitrol," http://smartgridnw.org/membership/member-organizations/qualitrol/, accessed Oct. 13, 2015, 3 pages.

Jiang, R. et al., "Energy-theft detection issues for advanced metering infrastructure in smart grid," IEEE, Tsinghua Science and Technology, vol. 19, Issue 2, Apr. 15, 2014 (16 pages).

Blumsack, S. et al., Abstract of "Ready or not, here comes the smart grid!" Energy, vol. 37, Issue 1, Jan. 2012 (pp. 61-68).

McLaughlin, S. et al., "Energy theft in the advanced metering infrastructure," Abstract, Critical Information Infrastructures Security, Sep. 30, 2009 (pp. 176-187).

International Search Report dated Dec. 19, 2016 in international patent application No. PCT/US16/50393 (11 pages).

International Search Report and Written Opinion, International Application No. PCT/US2017/46991, dated Nov. 21, 2017 (8 pages).

\* cited by examiner

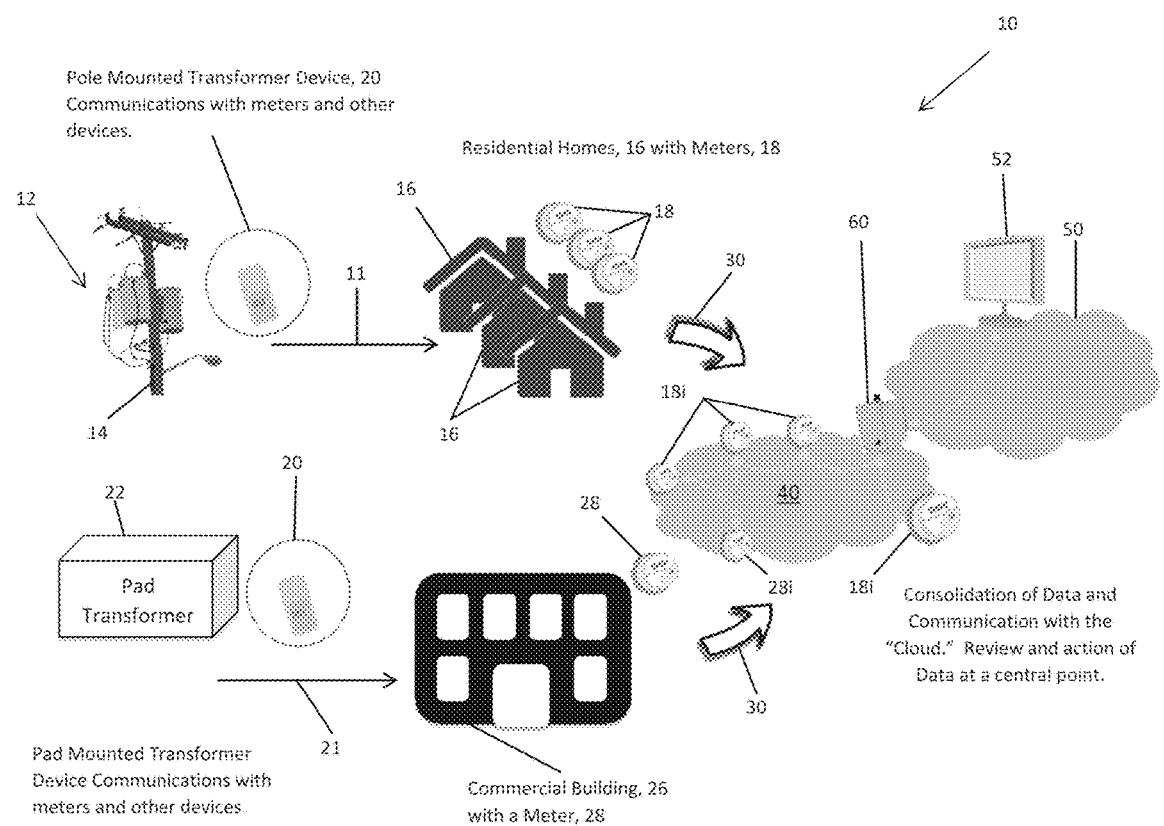
Figure 1A: Example of Network having Residential and Commercial Structures with Transformer Monitor / Data Collector Device

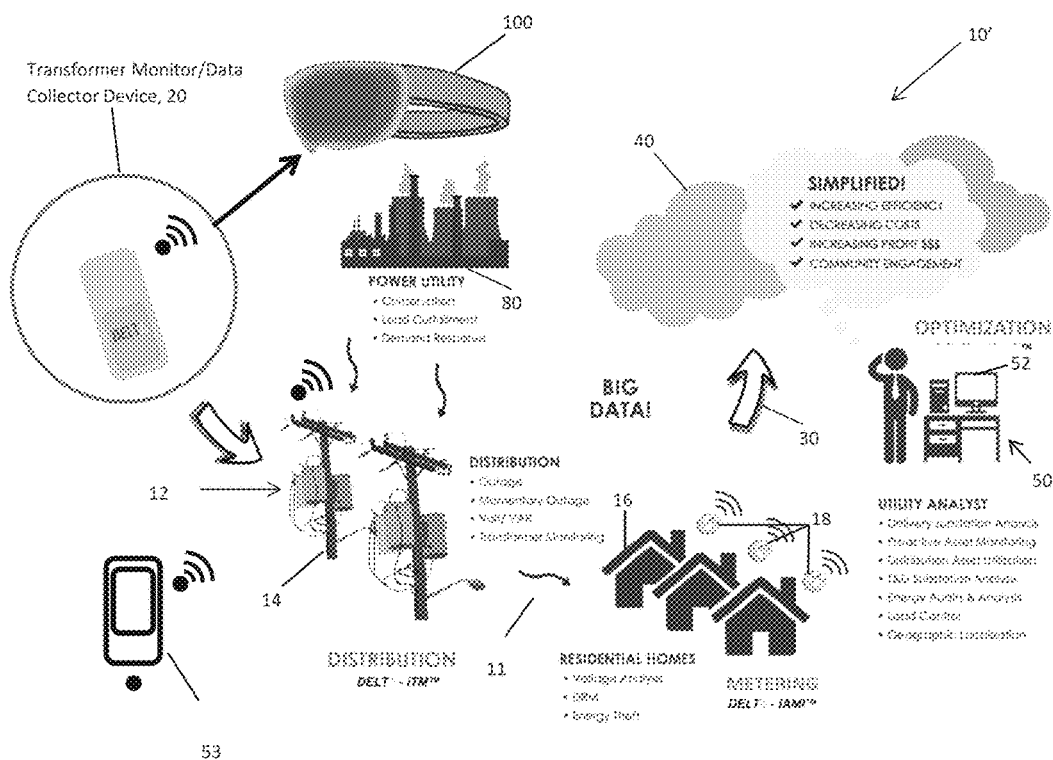
Figure 1B: Example of Network having Residential and Commercial Structures with Transformer Monitor / Data Collector Device

SYSTEM AND METHOD FOR DETERMINATION AND REMEDIATION OF ENERGY DIVERSION IN A SMART GRID NETWORK

CROSS REFERENCE TO RELATED APPLICATION

This application claims benefit to U.S. provisional application No. 62/213,815, filed 3 Sep. 2015, which is hereby incorporated by reference in its entirety.

The present invention forms part of, and builds on, the family of technologies disclosed in the other related applications identified below.

BACKGROUND OF THE INVENTION

1. Field of the Invention

The present invention relates to a system for determination and remediation of energy diversion in a power grid network; and more particularly, the present invention relates to a method and apparatus for determination and remediation of energy diversion in a smart power grid network.

2. Brief Description of Related Art

Proliferation of the "Internet of Things" (IoT) is driving interconnected smart systems. In particular, smart grids are following this trend though the establishment of smart energy, gas and water management. Interconnected components are now providing an unprecedented level of intelligence supporting numerous operational actions. This landscape is ushering in vast amounts of unstructured data and the need for intelligent data parsing, analysis and action systems.

It is estimated that in the United States and Canada alone, 1% to 2% of energy is purposely diverted by customers in the form of theft or line loss, accounting for nearly $6 billion in unrealized revenue. The purposeful diversion of energy is an even greater issue in developing regions with some estimates defining approximately $47 billion in unrealized revenue in these regions. Globally, estimates define approximately $202 billion in unrealized revenue due to purposeful diversion of energy.

One solution that has been presented to address the problem of purposeful energy diversion is to build a tamper switch mechanism into a home or commercial electric meter. The tamper switch triggers an alarm in the event that a meter has been tampered with by an end user, which can identify a possible energy theft occurrence. However, in practice, the tamper switches are unreliable. For example, some tamper switches may be frequently dislodged or moved inadvertently by the end user or an object coming into contact with the electric meter, which causes false alarms. As a result of the frequency of the false alarms, alarms generated by tamper switches are frequently ignored by utility operators, frustrating the entire purpose of the tamper switch.

What is needed is a reliable solution that allows detecting an occurrence of energy diversion with reliability that cannot be manipulated by the end user or subject to false triggering.

SUMMARY OF THE INVENTION

Delta's DSGN™ (Delta Smart Grid Network) represents an Interconnected BIG DATA analytics system providing advanced intelligence and synergistic components across power distribution, metering and optimization. The DSGN™ incorporates discrete elements in transformer monitoring and communications, residential and commercial metering and analytical, predictive and pre-emptive software algorithms. The hardware associated with the DSGN™ facilitates communications with transformers, residential and commercial meters and other Internet or wirelessly connected devices (commonly referred to as the "Internet of Things"). The DSGN's geographically disbursed assets support system optimization capabilities, some of which are in logistically difficult areas to reference, re-locate, interrogate and service. Consequently, the opportunity exists to drive substantial efficiencies in data visualization, evaluation, diagnosis, optimization, and servicing using enhanced reality systems across this interconnected smart grid network and similar networks.

Taken collectively, Delta Energy & Communications' business portfolio and financial strategy betters current offerings through its intimate understanding of our utility partners' pain points, core needs and anticipated delights.

Most importantly, the DSGN™'s hardware, software and network solution allows for the identification of the purposeful diversion of energy (i.e., theft) and the focused remediation of the offending areas or subjects, subsequently enhancing enterprise revenues.

In accordance with a first aspect of the invention, an apparatus is provided comprising a signal processor. The signal processor is configured to receive signaling containing information about geo-spatial assets that is received from transformer and residential/commercial metering locations interconnected by Internet/wireless/optical connected devices in a smart distributed power grid network, and determine corresponding signaling containing information about energy diversion of geo-spatial assets, based upon the signaling received. The signaling may include information about energy diversion assets that are highlighted geo-spatially in relation to other geo-spatial assets in the smart distributed power grid network. The signal processor of the apparatus may further be configured to select current and historical data for the energy diversion assets in order to identify the extent of the energy diversion, a database for storing the current and historical data may be provided. In one embodiment of the apparatus, the signaling may further include information about summary data regarding local and regional energy diversion statistics that are summarized with each energy diversion asset, providing the capability to prioritize instances of energy diversion to be corrected accordingly. In a further embodiment of the apparatus, the signaling may include information about summary data regarding local and regional energy diversion statistics that are summarized with each energy diversion asset, providing the capability to prioritize instances of energy diversion to be corrected accordingly. In an embodiment of the apparatus, the signaling may include information about an asset radar that provides a summary of asset location, within specified distance increments, including information related to different assets, including optional selections that allow a user to focus on potential issues or specific cases of energy diversion. Different colored elements or icons may be provided on the asset radar to identify different assets.

In accordance further with the first aspect of the invention, the apparatus forms part of the smart distributed power grid network that includes smart transformers, smart residential/commercial meters and other smart nodes interconnected as the Internet/wireless/optical connected devices. In an embodiment of the apparatus, each smart transformer is configured to provide a localized data aggregation and power flow investigation to establish a data capture capability wherever there is power. The smart transformer may comprise a smart transformer monitor and/or data collector device that communicates with the residential/commercial meters and other smart nodes in the distributed power grid network.

In accordance further with an embodiment of the first aspect of the invention, the signal processor may be configured to determine associated signaling containing information about a current level of energy diversion in the distributed power grid network, based upon the signal received. In an additional embodiment of the apparatus of the first aspect of the invention, the signal processor is configured to determine corresponding associated signaling containing information about the capability of a line loss/theft mitigation supporting application based upon the associated signaling.

In accordance with a second aspect of the invention, a smart grid network is provided. The smart grid network comprises a transformer, a transformer monitoring device, a plurality of electric meters and a cloud-based server. The transformer is configured to supply electric power to a plurality of structures. The transformer monitoring device comprises a signal processor and is configured to measure the amount of electricity supplied by the transformer to the plurality of structures. Each of the plurality of electric meters is configured to measure electricity usage at one of the plurality of structures and comprises a signal processor configured to transmit signaling containing information regarding measured electricity usage to the transformer monitoring device. The transformer monitoring device is configured to receive the signaling containing information regarding measured electricity usage from each of the plurality of electric meters and is configured transmit signaling to the cloud-based server containing information regarding the amount of electricity supplied by the transformer to the plurality of structures and the measured electricity usage. The cloud-based server comprises a signal processor and memory, and is configured to receive the signaling from the transformer monitoring device and to determine based on the received signaling if energy diversion is occurring in the smart grid network.

In accordance with an embodiment of the smart grid network of the second aspect of the invention, the cloud-based server is configured to determine if energy diversion is occurring in the smart grid network by determining if the difference between the amount of electricity supplied by the transformer, the measured electricity usage and a predetermined line loss value exceeds a predetermined threshold. The cloud-based server may further be configured to transmit signaling containing an alert message to the transformer monitoring device, if the cloud-based server determines energy diversion is occurring. The smart grid network may further comprise a user device comprising a signal processor and a graphical user interface. The transformer monitoring device may be configured to transmit signaling containing the alert message to the user device for display on the graphical user interface. The user device may further comprise eyewear to be worn by a user configured to receive the signaling and provide on a real-time visual display on the eyewear containing information about the energy diversion.

In accordance with an embodiment of the smart grid network of the second aspect of the invention, if the could-based server determines that energy diversion is occurring, the cloud-based server is configured to determine the location of the energy diversion. The cloud-based server may comprise a database of historical usage data measured by the plurality of electric meters, and be configured to determine the location of energy diversion by comparing the received measured usage data with the historical usage data. In a further embodiment, the cloud-based server is further configured to transmit signaling containing information relating to the location of the energy diversion to the transformer monitoring device, and the transformer monitoring device is configured to transmit signaling containing the alert message to a user device in the smart grid network for display on the user device.

In accordance with a further embodiment of the smart grid network according to the second aspect of the invention, the smart grid network comprises a mesh network including the transformer monitoring device, the plurality of electric meters and the cloud-based server.

In accordance with a third aspect of the invention, a method is provided for use in a smart grid network. The method includes measuring, by a transformer monitoring device, the amount of electricity supplied by a transformer to a plurality of structures in the smart grid network, and measuring, by a plurality of electric meters, each associated with one of the plurality of structures, electricity usage at each of the plurality of structures. The plurality of electric meters transmits signaling containing information regarding measured electricity usage to the transformer monitoring device. The transformer monitoring device transmits signaling containing information regarding the amount of electricity supplied by the transformer to the plurality of structures and the measured electricity usage to a cloud-based server. The method further includes determining, by the cloud-based server based on the signaling received from the transformer monitoring device, if energy diversion is occurring in the smart grid network. In accordance with an embodiment of the method of the third aspect of the invention, determining if energy diversion is occurring may comprise determining if the difference between the amount of electricity supplied by the transformer, the measured electricity usage and a predetermined line loss value exceeds a predetermined threshold.

BRIEF DESCRIPTION OF THE DRAWING

The drawings include the following Figures, which are not necessarily drawn to scale:

FIG. 1A is a diagram of a smart power grid network having a transformer monitor/data collection device, according to some embodiments of the present invention.

FIG. 1B is a diagram of a smart power grid network having a transformer monitor/data collection device, according to some embodiments of the present invention.

DETAILED DESCRIPTION OF THE INVENTION

Figure 2:
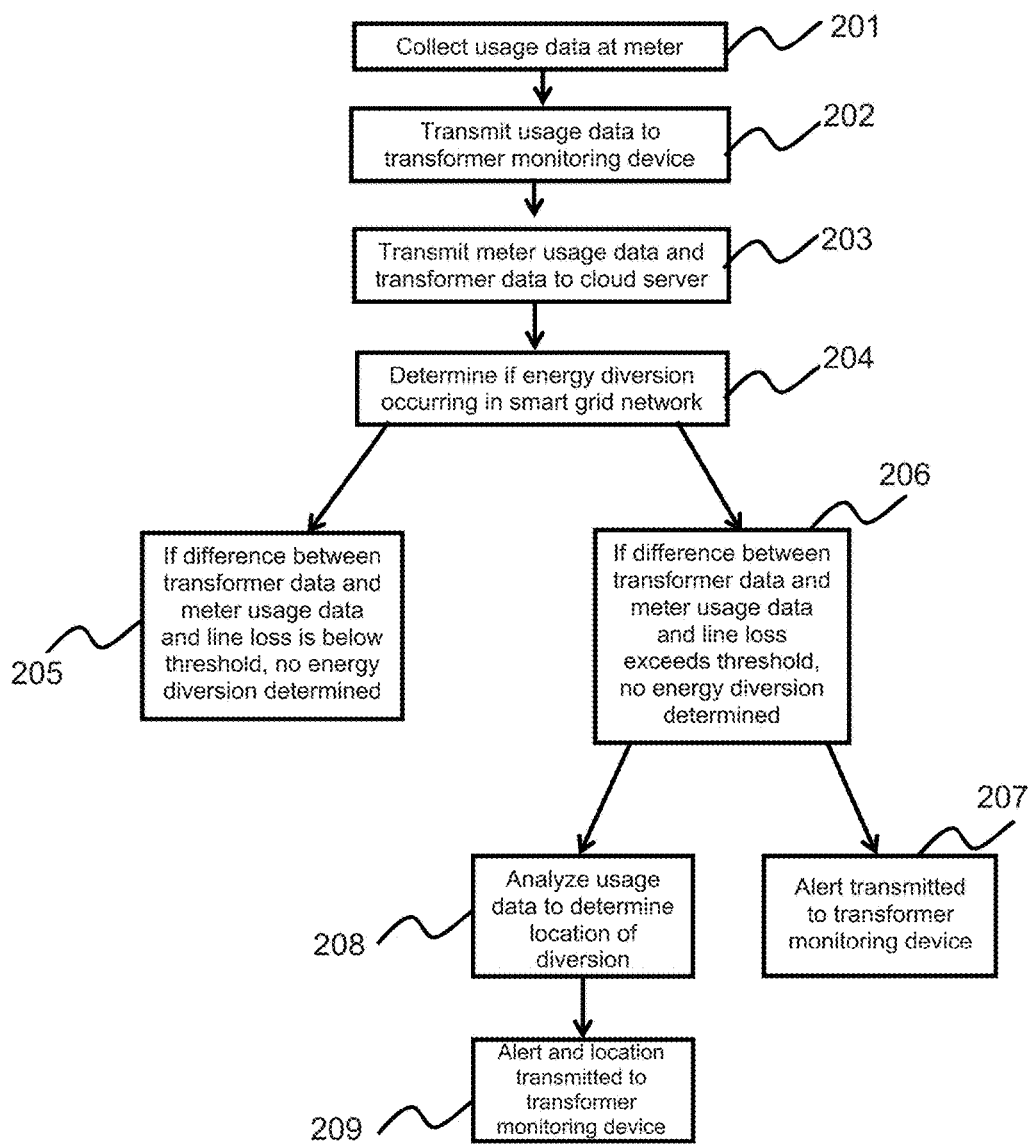
FIG. 2 illustrates a method of energy diversion identification, according to some embodiments of the present invention.

As shown in the Figures, the present invention incorporates a new and unique inclusion of wireless communications and data transmission capability into transformer monitoring modules 20, transformer monitoring being a core component within a so-called smart grid network according to the present invention. These transformer modules may be mounted directly to utility transformers in the field and may include the capability to both collect and transmit information received in signaling provided from a transformer, residential and commercial meters and/or other communication nodes that form part of other Internet/wireless connected devices in the smart grid network. The transformer module or device according to the present invention differs from other existing technology by incorporating a transceiver, transmitter and antenna/optical network collectively within the same device to both collect data from other network devices deployed in the field and communicate the collected data back to a central location or other connected devices, e.g., consistent with that disclosed herein.

According to some embodiments, the transformer module or device of the present invention may include four major components: water proof/environmentally sealed and human factors centric housing, transformer monitoring circuitry, smart grid collection circuitry, and radio/wireless mesh networking circuitry. By way of example, the transformer module or device may be attached to the transformer on the utility pole via magnets built into the housing and powered from the secondary side of the transformer using hermetically sealed interconnects, e.g., as shown in FIGS. 1A and 1B.

FIGS. 1A and 1B show big picture renditions of the overall smart power grid network, e.g., as a configuration/establishment of a baseline, power grid centric, smart utility mesh network, for implementing a pole mounted or pad mounted transformer monitor/smart data collector device according to the present invention to communicate upstream and downstream within the network.

The overall smart power grid network represents an interconnected so-called "BIG DATA" technology system providing advanced intelligence and synergistic components across power metering, distribution, communication, optimization, installation and servicing. The network incorporates discrete elements in the transformer monitoring and communications, residential and commercial metering and analytical, predictive and pre-emptive software algorithms. The hardware associated with the network facilitates communications with transformers, residential and commercial meters, and other Internet/wireless connected Internet of Things (IoT) devices. The network's geographically disbursed assets support a wireless mesh network communications extension, while aiding system optimization capabilities, noting that many assets are in logistically difficult areas to reference, re-locate, interrogate and service. The overall integrated system drives substantial efficiencies in data visualization, evaluation, diagnosis, optimization, and servicing using enhanced reality systems across this interconnected smart grid network and similar networks. The collective systems provide a synergistic and unique alternative network for BtB (business-to-business) and BtC (business-to-consumer) data receipt and delivery.

The smart grid network according to the present invention represents a singular, standardized, and scalable network, providing the industry's first inclusive solution from a singular supplier. The smart grid network is inclusive of four basic technology elements. The primary hardware and software constituents of the network are as noted and identified below.

1. The pole or pad mounted transformer monitor/smart data collector device is identified herein as element 20 (AKA "HyperSprout™" (and formerly known as "iTM™")), which is the localized data aggregation and power flow investigation; establishing a data capture and delivery capability wherever there is power, e.g., consistent with that set forth in U.S. application Ser. No. 15/160,754, which is hereby incorporated by reference in its entirety.

2. A digital data and delivery and receipt mesh network (AKA "DataVINE™" (formerly known as ("iAMI™")) is identified herein as element 40, which is a ubiquitous mesh network facilitating automated residential and commercial metering while deploying an alternative data delivery capability; enforcing a market leading 100% meter read capability, e.g., consistent with that set forth in U.S. application Ser. No. 15/250,119, as well as U.S. provisional application Ser. No. 62/244,919, and U.S. provisional application Ser. No. 62/299,348, each of which are hereby incorporated by reference in their entireties.

3. An Integrated solution pertaining to communication, data and asset serialization, and data modeling algorithms which provides for a comprehensive nodal exchange analysis of all grid parameters; realizing an inclusive geo-spatial understanding of utility operations, e.g., consistent with that set forth in U.S. provisional application Ser. No. 62/375,170, which is hereby incorporated by reference in its entirety.

4. An enhanced reality field investigation, interaction and servicing; deploying the industry's first "virtual" utility (AKA "PowerVISR™"), e.g., consistent with that set forth in U.S. application Ser. No. 15/234,293.

Taken collectively, this energy and communications portfolio and financial strategy improves over current offerings through its intimate understanding of utility partners' pain points, core needs and anticipated delights. The network hardware and software solution allows for the identification of the purposeful diversion of energy (i.e., theft) and the focused remediation of the offending areas or subjects, subsequently enhancing enterprise revenues.

As noted, the aforementioned overall combination provides an infinitely scalable data delivery and receipt capability for communities with poorly established, historical infrastructure while providing a synergistic network capability to those communities with current cellular capability.

By way of example, FIGS. 1A and 1B show examples of smart power grid networks generally indicated as 10 and 10', in accordance with some embodiments of the present invention. By way of example, the smart power grid networks may take the form of, or may be configured to include, one or more digital data and delivery and receipt mesh networks like element 40. Each digital data and delivery and receipt mesh network 40 includes communication nodes such as the transformer module or device 20 for exchanging information upstream and downstream between the communication nodes and the central location, which takes the form of the private network 50 in FIGS. 1A and 1B. Communication nodes are configured to be able exchange such upstream and downstream information between themselves in order to exchange such upstream and downstream information between a respective communication node and the central location. Represented within this figure is the concept of a data storage "cloud." The cloud represents an external digital storage media and/or series of storage devices, accessible via multiple wireless/optical connectivity methodologies and useable as a vehicle for delivering smart grid parameters to multiple assets within the smart grid, e.g. smart node power grid communication protocol, head-mounted user device, and other associated and non-associated elements. In FIGS. 1A and 1B, similar elements are provided with similar reference labels.

In FIGS. 1A and 1B, the smart power grid networks 10, 10' include transformers like elements 12, 22 for providing electric energy to residential homes and commercial buildings like elements 16, 26, each having a respective electrical meter like elements 18, 28 for measuring the associated electrical energy usage. The smart power grid networks 10, 10' also include transformer monitor/data collection devices 20 configured to collect data about the electrical energy usage in relation to residential homes and commercial buildings 16, 26 from the respective electrical meter like elements 18, 28. For example, each electrical meter 18, 28 may provide metered data signaling containing information about metered data related to associated electrical signaling being supplied from the transformer 12, 22 to the building or structure 16, 26 in the grid network 10, 10'. Moreover, transformer monitor/data collection devices 20 may receive associated signaling containing information about electrical signaling data related to electricity being processed by the transformer 12, 22 located and arranged in the grid network and to which the transformer monitoring device is mounted, as well as other wireless/optical network data related to other communication nodes/end points forming part of other wireless/optical network devices deployed in the grid network. In effect, the collected data received by the transformer monitor device 20 may include some combination of the electrical signaling data related to the transformer, the metered data related to the electrical meter and/or the other wireless/optical network data related to other communication nodes/end points in the grid network.

The data collected by the transformer monitor device 20 from electric meters 18, 28 and transformer 12, 22 includes data relating to the transformer and power measurement, including, active energy accumulation (kWh), instantaneous RMS voltage (V), maximum RMS voltage (V), minimum RMS voltage (V), apparent energy accumulation (kVAh), peak kilowatts, cumulative kilowatts, instantaneous RMS current (A), maximum RMS current (A), minimum RMS current (A), active power (W), apparent power (VA), line cycle period (ms), top oil temperature, bottom oil temperature, ambient temperature, harmonics, phase angle measurement (whether the energy on a poly phase transformer is out of phase), internal GPS and two-hour internal battery. Data relating to the transformer power measurement is also collected, including Rogowski coil measurements and CT (current transformer) coil measurements. Alarms may be provided by the transformer monitor device 20 to a head-mounted user device 100 or network computer 52 for certain situations, such as over temperature, over load or demand, power loss, low oil level and tampering. The data can be collected by transformer monitor device 20 periodically at different intervals, including every 1, 5, 15, 30 or 60 minutes, or may be collected on demand of the user. Additional optional measurements include low oil level, moisture level and energy theft calculation.

The transformer monitor/data collection devices 20 are also configured to provide suitable signaling 30 containing information about the collected data to a private network 50 via the digital data and delivery and receipt mesh network 40. The private network 50 is configured as a central point that processes the collected data. e.g., performing utility analysis that may include one or more of the following: delivery subtraction analysis, proactive asset monitoring, distribution asset utilization, T and D subtraction analysis, energy audits and analysis, load control, and geographic localization. This central point may exist in a cloud environment, accessible via multiple wireless/optical connectivity or wired connectivity methodologies. By way of example, the utility analysis is performed in an effort to increase efficiency, decrease costs, increase profits and/or community engagement related to the operation of the smart grid network.

FIGS. 1A and 1B show a pole mounted transformer device 20 in communication with the electrical meter 18 associated with the residential home 16. By way of example, the electrical meter 18 may be configured to measure single phase electrical energy provided by the transformer 12, mounted to a pole 14, along a single phase utility line 11 to the residential home 16.

FIG. 1A also shows a pad mounted transformer device 20 in communication with the electrical meter 28 associated with the commercial building 26. By way of example, the electrical meter 28 may be configured to measure three (3) phase electrical energy provided by the pad transformer 22 along a three (3) phase utility line 21 to the commercial building home 26. FIG. 1B also shows a power utility 80 configured to provide the electrical energy in the smart grid network 10'.

FIG. 1B shows that the transformer device 20 may be configured to collect data related to some distribution related functionality, e.g., including determinations related to outage, momentary outage, voltage/VAR, and/or transformer monitoring. FIG. 1B shows that the transformer device 20 may be configured to collect data related to some voltage analysis, DRM (digital rights management) functionality and energy theft functionality in relation to its associated residential home or commercial building. The transformer device 20 provides the suitable signaling 30 containing information about the collected data to the private network 50 via the digital data and delivery and receipt mesh network 40. The collected data received by the private network 50 may also be analyzed in relation to conservation, load curtailment and/or a demand response vis-a-vis the power utility 80. In FIG. 1B, the private network 50 may include a private network computer and monitor generally indicated as 52 for performing or implementing the aforementioned analysis and functionality. In many cases this private network computer and monitor may be accessing the noted smart grid data via a cloud environment, accessible via multiple wireless/optical connectivity or wired connectivity methodologies. FIG. 1B also shows both the receipt and transmission of digital data across the defined wireless/optical mesh network to a representative IoT device indicated as 53, e.g., which may take the form of a smart phone, tablet, computer, laptop, wearable device, etc.

FIG. 1A shows that the digital data and delivery and receipt mesh network 40 may include other transformer devices like element 20 exchanging information with other meters like elements 18i, 28i associated with other buildings or structures like elements 16, 26.

FIG. 1A also shows a relay 60 coupled between the digital data and delivery and receipt mesh network 40 and the private network 50. By way of example, the relay 60 is shown as 5 GHz relay for communicating with a corresponding 5 GHz private network 50, although the scope of the invention is not intended to be limited to any particular frequency or transmissions/receipt media for the relay or network.

A head-mounted user device 100 is provided in accordance with the present invention, which is configured for use with the smart grid network 10 or 10' and its component elements. The head-mounted user device 100 is configured for visualizing, evaluating, diagnosing, optimizing and servicing the smart grid network 10 and the assets contained within the smart grid network 10 or 10'. As used herein, the term "asset" or "assets" may refer to any device that may form part of the smart grid network 10 or 10' or be used in the maintenance or monitoring of the smart grid network 10 or 10', including but not limited to, transformer monitor device 20, electric meters 18, additional heat-mounted user devices 100, substation monitors, electromagnetic pulse detection devices, mobile devices identified in the network (e.g., utility vehicles technicians and digital devices associated therewith), geographically fixed items identified in the network (e.g., utility poles, junction points, commercial or residential structures), IoT devices 53, and networks formed by the aforementioned devices, including mesh network 40, as well as other items not associated with the smart grid network or other IoT devices, but for which there is established a referenced geo-location or moving/variable coordinate capability.

The head-mounted user device 100 is configured for communication with assets in the smart grid network 10, such as transformer mounted data collection devices 20 and electric meters 18. The head-mounted user device 100 receives information from and about the assets in the smart grid network 10, and displays information on a display screen 102 of the device 100 in user's line of sight. The user of the head-mounted device 100 may be, for example, a field technician or a system installer.

A transformer mounted data collection device 20 transmits signaling to the head-mounted user device 100, which contains information about the performance of assets in the smart grid network 10. This transmission may be occurring directly from the referenced private network or indirectly via the referenced cloud environment. The user of the head-mounted user device 100 is therefore able to track and monitor the performance of assets in the smart grid network 10 while working in the field. The information transmitted from the transformer mounted data collection device 20 also may include information about the location of assets in the smart grid network 10, such as the GPS coordinates of the asset. The head-mounted user device 100 comprises a geographic positioning component configured to determine the GPS coordinates of device 100. As such, the processor of the device 100 is configured to determine the locations of assets relative to the device 100. This location information can be displayed to the user in a variety of manners, including for example, a radar-like display which displays to the user the distance and direction to one or more assets, or routing information, which displays to the user a route from the current position of the user wearing the device 100 to the asset onto a map. The head-mounted user device 100 is configured to track the movement of the device 100, and for any asset that is not in a fixed location, the head-mounted user device 100 also receives updated positioning information for the asset. As such, the location information displayed by the device 100 can be updated on a real-time basis to reflect the movement of the user and device 100.

While the head-mounted device 100 is configured to receive information from the transformer mounted data collection device 20 regarding, for example, multiple electric meters 18 in a smart grid network 10, the head-mounted device 100 may also be configured to interact directly with assets such as an electric meter 18. The head-mounted device 100 can be configured to interact with the electric meter 18, or another asset, during installation or investigation of the electric meter 18, for example.

FIG. 2

In accordance with the present invention, a system and method for detecting and remediating energy diversion in a smart grid network is provided.

Data is collected from the transformer monitoring device 20 and electric meters 18 and transmitted into the "cloud" environment 50 of the smart grid network 10, comprising a server. The server comprises a processor and a memory, together forming a server analytics platform, with the memory stored with instructions, which when executed by the processor, is configured to cause the server to determine if an instance of energy diversion is occurring in the smart grid network 10.

The server analytics platform is configured to determine both operational and non-operational losses in assets and, subsequently, in revenue, which can be displayed to a user on the private network computer device and monitor 52, a head mounted user device 100 in the network 40, or an alternative user device. The server analytics platform is also configured to parse, aggregate and summarize data from adjacent IoT digital devices 53 and mesh network enabled systems, expanding analytics capabilities beyond smart grid applications.

The above-referenced systems may be used in determination of energy theft in the smart grid network 10, as shown in FIGS. 1A and 1B. The server analytics platform identifies the energy theft areas of concern and presents them to the user within a graphical user interface (GUI) of a computer device 52 or a head mounted user device 100 in the network 40.

FIG. 2 illustrates a method for detecting energy diversion in a smart grid network 10, in accordance with an embodiment of the present invention.

In a smart grid network 10, the transformer 12 delivers an amount of electricity to the structures 16, 26 within the network 10 that are connected to the transformer 12 via the power lines. Electric meters 18, 28 at the structures 16, 26 collect data (201) regarding the amount of energy usage at the structures 16, 26 over a period of time. The electric meter 18, 28 usage data is transmitted (202) to the transformer monitoring device 20 in the smart grid network 10, in the form of signaling containing the usage data. The transformer monitoring device 20 is further configured to measure the amount of electricity delivered to the network 10 by the particular transformer 12 over the same period of time corresponding to the collected usage data from the meters 18, 28.

The data collected at the transformer monitor device 20 from the transformer 12 and electric meters 18, 28 regarding the amount of energy delivered by the transformer 12 and measured use at the meters 18, 28 is transmitted (203) through the smart grid network 10 to the central server, having the server analytics platform. This allows for easily and readily defining energy theft using the captured data.

The server analytics platform receives information from the transformer monitor device 20 regarding the amount of power distributed by the transformer 12 (in kWh) and the amount of power delivered by the transformer 12 to each of the meters 18 receiving power from the transformer 12 (in kWh). A serial number or other identifying information for the transformer 12 may also be received by the server analytics platform. Based on the received signaling containing data collected by the transformer monitor device 20, the server analytics platform is configured to determine (204) if energy diversion is occurring. The server analytics platform makes such a determination by comparing the amount of energy delivered by the transformer 12 and the total energy received by all meters 18, 28 that are receiving electricity from the particular transformer 12, according to the usage data from the meters 18, 28. The amount of line loss in the delivery of electricity from the particular transformer 12 is included in the comparison made by the server analytics platform. The line loss value is provided to the server analytics platform, and corresponds to an amount of electricity that it is delivered by the transformer 12 but lost over the course of the delivery, such that is known in advance that it will not be measured as electricity used at the structures. The line loss value may predetermined for a particular transformer 12 and collection of wires delivering electricity from the transformer 12. Line loss is a function of the associated transmission wire lengths and gauges.

The sever analytics platform is configured to determine the difference between the amount of energy delivered by the transformer 12 and the total energy received by all meters 18 plus the line loss value. Under ordinary circumstances, for the particular transformer 12, the total energy delivered by the transformer 12 should be the same as the total energy received by the meters 18, 28 with the exception of any energy lost due to line loss. Thus, the determined difference should be at or near zero. A predetermined value may be set as a threshold for the measured difference between energy delivered and the energy used and line loss, which can be zero or another predetermined value that is considered to be an acceptable difference for purposes of classifying an occurrence of energy diversion. If the server analytics platform determines (205) that the difference is less than the predetermined threshold, then it is determined that there is no energy diversion occurring. If the server analytics platform determines (206) that the difference is more than the predetermined threshold, then it is determined that there is a likely occurrence of energy diversion, and one or more remediation methods can be taken, as detailed further below.

The server analytics platform is configured to transmit (207) signaling containing information including the energy diversion determination to the transformer monitor device 20, which may provide the information to a head-mounted user device 100. Further, the server analytics platform may transmit signaling containing information including the energy diversion determination directly to the head-mounted user device 100 or to another computing device in the mesh network 40 having a graphical user interface to display the information to a user, such as computer 52.

The server analytics platform may further be configured to determine (208) the location of an end user responsible for the energy diversion. As previously described, usage data collected at the electric meters 18, 28 is transmitted to the transformer monitoring device 20, and transmitted to the cloud-based server. The data is stored at the server, creating a database of historical data relating to energy usage at structures 16, 26 in the smart grid network 10. If an occurrence of energy diversion is determined, then the server is configured to determine the possible location of the energy diversion by retrieving the historical data from the database and comparing past energy usage measured by particular meters 18, 28 to the energy usage measured during the relevant time period. For example, if it is determined that one particular electric meter 18 has measured significantly less energy usage during the period of time than has been measured by the electric meter 18 in the past, it can be determined that the location of the electric meter 18 may be where energy diversion is occurring. The server analytics platform is configured to transmit (209) signaling containing information including the energy diversion determination and the location of the energy diversion to the transformer monitor device 20, which may provide the information to a head-mounted user device 100. Further, the server analytics platform may transmit signaling containing information including the energy diversion determination and location information directly to the head-mounted user device 100, or to another computing device in the mesh network 40 having a graphical user interface to display the information to a user, such as computer 52.

Further, the server analytics platform may make further determinations relating to the energy diversion, including the number of energy theft incidents, the amount of energy lost by theft, both in kWh and dollars, and theft patterns overtime. The server analytics platform may transmit signaling containing information including these determination to the transformer monitor device 20, which may provide the information to a head-mounted user device 100 for display in graphical or text form. Further, the server analytics platform may transmit signaling containing information including the energy diversion determination directly to the head-mounted user device 100, or to another computing device in the mesh network 40 having a graphical user interface to display the information to a user in graphical or text form, such as computer 50.

Upon detecting an occurrence of deliberate energy diversion, a variety of mitigation techniques can be deployed. These techniques may vary dependent upon the individual utility. For example, a utility may elect to visit the location, identify the theft and shut-off power. Alternatively, a utility may elect to contact local authorities to mediate the situation directly and only indirectly be involved.

Furthermore, the central server 50 of the smart grid network 10 may be configured to remotely disconnect an electric meter 18, thereby shutting off power if it is believed an abuse is occurring or a non-payment situation exists.

In some impoverished areas, the utility may be unable to take any action, due to local socioeconomic conditions or government intervention schemes. In these areas, several activities may be pursued. After identification, the utility may pursue subsidies to rebate the losses, and keep power going, from the government. Many governments are supportive of this scheme as it allows those in need to continue receiving power for essentials, e.g. cooking, enterprise at night or general lighting for education/children's activities. The utility may simply incorporate the losses into a government endorsed "development plan," effectively writing off the losses as part of government mandated socio-economic policy requirements. Additionally, the utility can set the customer up on a pre-payment meter.

FIG. 3

Figure 3:
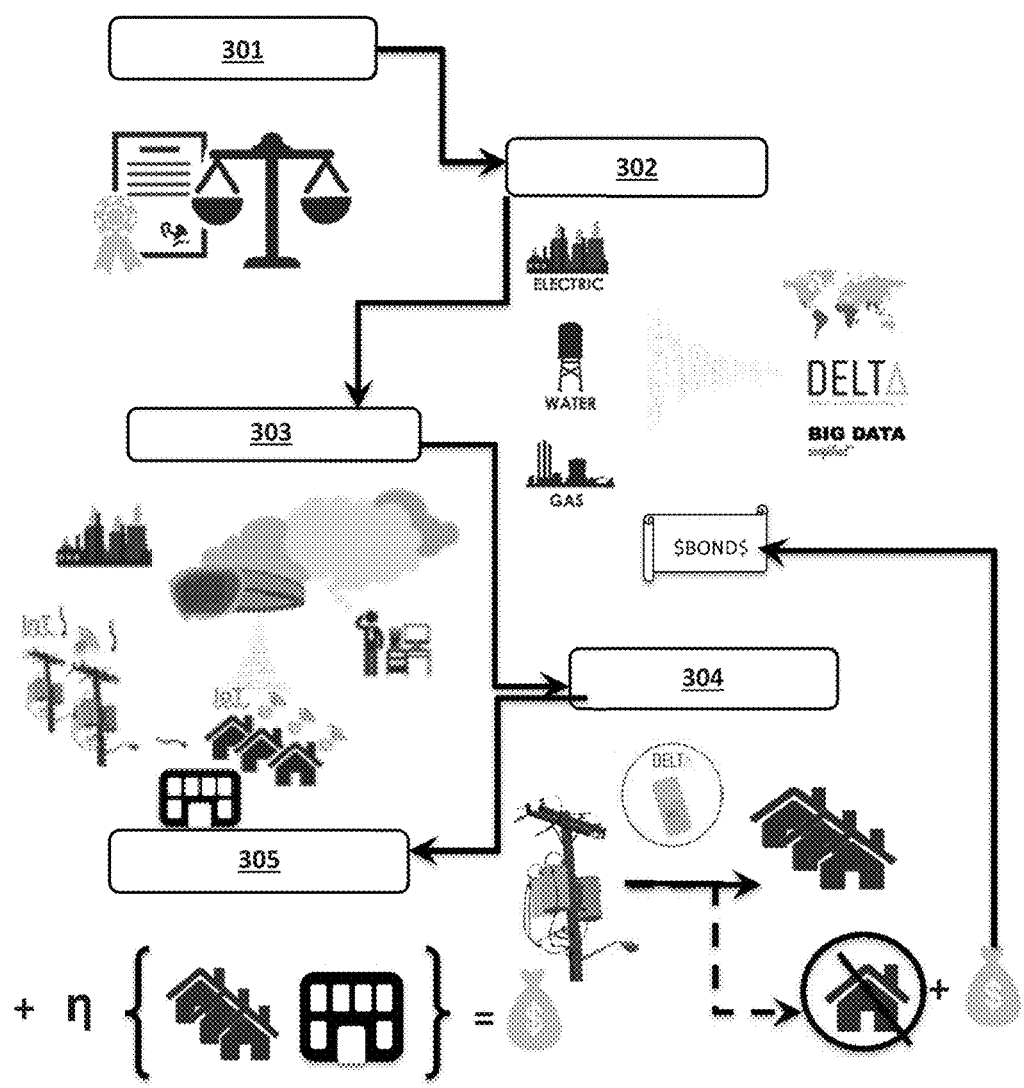
FIG. 3 is a diagram of an energy diversion remediation financing model, according to some embodiments of the present invention.

FIG. 3 shows an exemplary embodiment for smart grid refinancing through purposeful diversion mitigation.

In focused geographies, energy diversion rates have been quoted from 10% of utility profits to greater than 50% of utility profits. Recognizing that utility profits can easily run in the range of tens of millions of dollars per month, overall purposeful diversion impact can easily run in the millions of dollars per month. Application of the method and system for energy diversion detection in a smart grid network as described herein allows for the immediate identification, localization and remediation of these purposeful diversion situations, allowing for the enhanced revenue to be funneled into utility investments, at the utility's discretion. This novel approach allows for the smart grid network implementation to be virtually self-funding, based upon the discounted cash flows associated with remediated purposeful diversion being rolled into a financial rebalancing package.

In deploying the smart grid network of the present invention, the following, novel theft mitigation revenue financing process is administered.

In a first step 301, the focused utility's financial statements can be reviewed to determine financial health and the current level of energy diversion and associated revenue losses suffered by the company. Determination is made as to the capability of the line loss/theft mitigation supporting application of the financing model. A discounted cash flow summary is created to judge the effects of the mitigation strategy, timed to coincide with the anticipated system installation schedule.

A bond issuance (302) is made against favorable mitigation strategy. Financial models are used to define a custom utility bond strategy in support of smart grid network installation financing. The bond strategy and resulting financing specifics are based upon the discounted cash flows noted above, inclusive of theft mitigation enhanced revenue. Traditionally, installation of smart grids on prior non-optimized systems can result in efficiency gains ranging from 10% to greater than 20%.

The smart grid network is implemented (303) in alignment with the scheduled financing package and bond strategy. High theft areas are prioritized first, along with other areas ranked higher in importance by the implementing utility.

Theft mitigation revenue enhancement is immediately realized (304) in the initial focus areas. Other areas are staged for smart grid network installation and remediation, based upon the requirements of the implementing utility.

Operational efficiency gains are realized (305) in all areas of the smart grid network installation. Expectations for revenue enhancements, outside of theft mitigation, are based upon operating cost reductions, pre-emptive & pro-active asset management techniques and general system wide efficiency gains.

Other Related Applications

The application is related to other patent applications, some of which are identified above, that together form part of the overall family of technologies developed by one or more of the inventors herein, and disclosed in the following applications, which are all incorporated by reference in their entirety:

U.S. application Ser. No. 15/160,754, filed 20 May 2016, entitled "Transformer Monitor, Communications and Data Collection Device" and U.S. Provisional application Ser. No. 62/203,101 filed 10 Aug. 2015;

U.S. application Ser. No. 15/234,293, filed 11 Aug. 2016, entitled "Enhanced reality system for visualizing, evaluating, diagnosing, optimizing and servicing smart grids and incorporated components" and U.S. Provisional application Ser. No. 62/203,719 filed 11 Aug. 2015;

U.S. provisional application Ser. No. 62/375,170, filed 15 Aug. 2016, entitled "Integrated solution of Internet of Things, DSGN™, and iDAP™ pertaining to Communication, Data and Asset Serialization, and Delta Data Modeling Algorithms;"

U.S. application Ser. No. 15/250,119, filed 29 Aug. 2015, entitled "Supplemental and alternative digital data delivery and receipt mesh network realized through the placement of enhanced transformer mounted monitoring devices" and U.S. Provisional application Ser. No. 62/236,420 filed 2 Oct. 2015

U.S. provisional application Ser. No. 62/244,914, filed 22 Oct. 2015, entitled "Augmentation, expansion and self-healing of a geographically distributed mesh network using unmanned aerial vehicle (UAV) technology;"

U.S. provisional application Ser. No. 62/244,919, filed 22 Oct. 2015, entitled "Data transfer facilitation across a distributed mesh network using light and optical based technology;" and U.S. provisional application Ser. No. 62/299,348, filed 24 Feb. 2016, entitled "Distributed 802.11s mesh network using HYPERSPROUT hardware for the capture and transmission of data."

The Scope of the Invention

It should be understood that, unless stated otherwise herein, any of the features, characteristics, alternatives or modifications described regarding a particular embodiment herein may also be applied, used, or incorporated with any other embodiment described herein. Also, the drawing herein is not drawn to scale.

Although the invention has been described and illustrated with respect to exemplary embodiments thereof, the foregoing and various other additions and omissions may be made therein and thereto without departing from the spirit and scope of the present invention.

What we claim is:
1. A smart grid network comprising:
a transformer configured to supply electric power to a plurality of structures;
a transformer monitoring device comprising a signal processor and configured to receive signaling containing information about the amount of electricity supplied by the transformer to the plurality of structures;
a plurality of electric meters, each configured to measure electricity usage at one of the plurality of structures and comprising a signal processor configured to transmit signaling containing information regarding measured electricity usage to the transformer monitoring device; and
a cloud-based server comprising a signal processor and memory;
wherein the transformer monitoring device is configured to receive the signaling containing information regarding measured electricity usage from each of the plurality of electric meters and is configured to determine and transmit signaling to the cloud-based server containing information regarding the amount of electricity supplied by the transformer to the plurality of structures and the measured electricity usage; and
wherein the cloud-based server is configured to receive the signaling from the transformer monitoring device and to determine based on the received signaling if energy diversion is occurring in the smart grid network;
wherein if the cloud-based server determines that energy diversion is occurring, the cloud-based server is configured to determine the location of the energy diversion, and
wherein the cloud-based server is further configured to transmit signaling containing information relating to the location of the energy diversion to the transformer monitoring device, and wherein the transformer monitoring device is configured to transmit signaling containing an alert message to a user device in the smart grid network for display on the user device.

2. The smart grid network according to claim 1, wherein the cloud-based server is configured to determine if energy diversion is occurring in the smart grid network by determining if the difference between the amount of electricity supplied by the transformer, the measured electricity usage and a predetermined line loss value exceeds a predetermined threshold.

3. The smart grid network according to claim 2, wherein cloud-based server is further configured to transmit signaling containing an alert message to the transformer monitoring device, if the cloud-based server determines energy diversion is occurring.

4. The smart grid network according to claim 1, wherein the signaling transmitted to the user device includes the information relating to the location of the energy diversion.

5. The smart grid network according to claim 1, wherein the cloud-based server comprises a database of historical usage data measured by the plurality of electric meters, and is configured to determine the location of energy diversion by comparing the received measured usage data with the historical usage data.

6. The smart grid network according to claim 4, wherein the user device comprises eyewear to be worn by a user configured to receive the signaling and provide on a real-time visual display on the eyewear information about the energy diversion.

7. The smart grid network according to claim 1, further comprising a mesh network including the transformer monitoring device, the plurality of electric meters and the cloud-based server.

8. A method for use in a smart grid network comprising:
measuring, by a transformer monitoring device, the amount of electricity supplied by a transformer to a plurality of structures in the smart grid network;
measuring, by a plurality of electric meters, each associated with one of the plurality of structures, electricity usage at each of the plurality of structures;
transmitting, by the plurality of electric meters, signaling containing information regarding measured electricity usage to the transformer monitoring device;
receiving, by the transformer monitoring device, the signaling containing information regarding measured electricity usage;
transmitting, by the transformer monitoring device, signaling containing information regarding the amount of electricity supplied by the transformer to the plurality of structures and the measured electricity usage to a cloud-based server;
determining, by the cloud-based server based on the signaling received from the transformer monitoring device, if energy diversion is occurring in the smart grid network;
determining, by the cloud-based server, if energy diversion is occurring and the location of the energy diversion,
transmitting, by the cloud-based server signaling containing information relating to the location of the energy diversion to the transformer monitoring device, and
transmitting, by the transformer monitoring device, signaling containing an alert message to a user device in the smart grid network for display on the user device.

9. The method according to claim 8, wherein said determining if energy diversion is occurring comprises determining if the difference between the amount of electricity supplied by the transformer, the measured electricity usage and a predetermined line loss value exceeds a predetermined threshold.

10. The method according to claim 8, wherein the signaling transmitted to the user device includes the information relating to the location of the energy diversion.

* * * * *